(12) United States Patent
Suzuki et al.

(10) Patent No.: US 10,225,923 B2
(45) Date of Patent: Mar. 5, 2019

(54) ELECTRONIC CIRCUIT MODULE AND MANUFACTURING METHOD OF THE SAME

(71) Applicant: TDK Corporation, Tokyo (JP)

(72) Inventors: Yoshihiro Suzuki, Tokyo (JP); Tomohide Yokozawa, Tokyo (JP); Michitaka Okazaki, Yamagata (JP); Takuro Aoki, Tokyo (JP); Masashi Katsumata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/479,033

(22) Filed: Apr. 4, 2017

(65) Prior Publication Data

US 2017/0295643 A1 Oct. 12, 2017

(30) Foreign Application Priority Data

Apr. 12, 2016 (JP) .................................. 2016-079765

(51) Int. Cl.
| | |
|---|---|
| *H05K 1/09* | (2006.01) |
| *H05K 1/02* | (2006.01) |
| *H05K 1/11* | (2006.01) |
| *H05K 1/18* | (2006.01) |
| *H05K 3/30* | (2006.01) |
| *H05K 3/40* | (2006.01) |

(52) U.S. Cl.
CPC ........... *H05K 1/0216* (2013.01); *H05K 1/115* (2013.01); *H05K 1/182* (2013.01); *H05K 3/30* (2013.01); *H05K 3/4038* (2013.01); *H05K 2201/10371* (2013.01)

(58) Field of Classification Search
CPC ...... H05K 1/0216; H05K 1/182; H05K 1/115; H05K 3/30; H05K 3/4038; H05K 2201/10371
USPC .......................................... 174/251; 361/728
See application file for complete search history.

(56) References Cited

U.S. PATENT DOCUMENTS

| | | | | |
|---|---|---|---|---|
| 9,461,001 | B1 * | 10/2016 | Tsai ....................... | H01L 23/552 |
| 9,721,903 | B2 * | 8/2017 | Lee ........................ | H01L 23/552 |
| 2006/0267159 | A1 | 11/2006 | Yamamoto et al. | |
| 2007/0176281 | A1 | 8/2007 | Kim et al. | |
| 2008/0210462 | A1 | 9/2008 | Kawagishi et al. | |
| 2009/0002967 | A1 | 1/2009 | Asami | |
| 2012/0062439 | A1 * | 3/2012 | Liao ....................... | H01L 23/481 |
| | | | | 343/841 |
| 2012/0286415 | A1 | 11/2012 | Sakai et al. | |
| 2013/0292808 | A1 * | 11/2013 | Yen ....................... | H01L 23/552 |
| | | | | 257/660 |

(Continued)

FOREIGN PATENT DOCUMENTS

| | | |
|---|---|---|
| JP | 2010225752 A | 10/2010 |
| JP | 2013058513 A | 3/2013 |
| WO | 2008026247 A1 | 8/2006 |

*Primary Examiner* — Sherman Ng
(74) *Attorney, Agent, or Firm* — Young Law Firm, P.C.

(57) ABSTRACT

Disclosed herein is an electronic circuit module that includes a substrate having a power supply pattern, an electronic component mounted on a front surface of the substrate, a molding resin that covers the front surface of the substrate so as to embed the electronic component therein, a metal shield covering the molding resin, and a through conductor formed so as to penetrate through the molding resin to connect the metal shield to the power supply pattern.

19 Claims, 16 Drawing Sheets

(56) References Cited

U.S. PATENT DOCUMENTS

| | | | |
|---|---|---|---|
| 2015/0049439 A1* | 2/2015 | Shimamura | H05K 1/0216 361/728 |
| 2015/0070849 A1* | 3/2015 | Shimamura | H05K 1/0216 361/728 |
| 2015/0187705 A1 | 7/2015 | Chung | |
| 2016/0073496 A1* | 3/2016 | Vincent | H05K 1/0298 361/772 |

* cited by examiner

ELECTRONIC CIRCUIT MODULE AND MANUFACTURING METHOD OF THE SAME

BACKGROUND OF THE INVENTION

Field of the Invention

The present invention relates to an electronic circuit module and a manufacturing method therefor and, more particularly, to an electronic circuit module in which the upper surface of a molding resin is covered with a metal shield and a manufacturing method therefor.

Description of Related Art

In recent years, an electronic circuit module in which a large number of electronic components are modularized is widely used for an electronic device such as a smart phone. The electronic circuit module may emit electromagnetic noise or may be affected by external noise during its operation and, thus, in order to suppress this, the surface of the molding resin is sometimes covered with a metal shield (see Japanese Patent Application Laid-open No. 2010-225752).

In order to make the metal shield properly function as an electromagnetic shield, the metal shield needs to be connected to a power supply pattern such as a ground pattern. Thus, in conventional electronic circuit modules, the upper and side surfaces of the electronic circuit module are covered with the metal shield, and the metal shield formed on the side surface is connected to the power supply pattern so as to ground the entire metal shield.

However, forming the metal shield on the side surface of the electronic circuit module is not always easy and may cause an increase in manufacturing cost. In addition, connection between the metal shield on the side surface and power supply pattern is achieved by covering thin ground wiring exposed to the side surface of a substrate with the metal shield, so that connection reliability may be insufficient.

SUMMARY

It is therefore an object of the present invention to provide an electronic circuit module in which a metal shield formed on the upper surface of a molding resin can be easily and reliably connected to a power supply pattern and a manufacturing method therefor.

An electronic circuit module according to the present invention includes a substrate having a power supply pattern, an electronic component mounted on the front surface of the substrate, a molding resin that covers the front surface of the substrate so as to embed the electronic component therein, a metal shield that covers the molding resin, and a through conductor formed so as to penetrate through the molding resin and connect the metal shield to the power supply pattern.

According to the present invention, the metal shield and the power supply pattern are connected to each other through the through conductor penetrating through the molding resin, eliminating the need of forming a connection metal conductor on the side surface of the electronic circuit module, which facilitates manufacturing. In addition, the metal shield is reliably connected to the power supply pattern by the through conductor, so that connection reliability is significantly enhanced.

In the present invention, a plurality of the through conductors are preferably provided so as to surround the electronic component in a plan view. With this configuration, it is possible to shield electromagnetic noise emitted from the electronic component and external noise entering the electronic component.

In the present invention, the through conductor is preferably exposed to the side surface of the molding resin. This allows the through conductor exposed to the side surface to function as an electromagnetic shield on the side surface. Further, when a plurality of the electronic circuit modules are taken from an aggregate substrate, one through conductor is shared by two or more electronic circuit modules, so that the planar size of the electronic circuit module can be reduced.

In the present invention, the metal shield may cover the entire upper surface of the molding resin. With this configuration, it is possible to enhance electromagnetic shielding effect on the upper surface side. Alternatively, the metal shield may have an opening that exposes the upper surface of the molding resin. With this configuration, moisture contained in the molding resin is released from the opening during reflow, making it possible to enhance product reliability.

In the present invention, the metal shield may be selectively provided at a position that covers the electronic component. This reduces the height of a portion which does not require electromagnetic shielding and makes the metal shield and other electronic components unlikely to short-circuit.

The electronic circuit module according to the present invention may further include a metal conductor provided so as to cover the molding resin and to be insulated and isolated from the metal shield and another through conductor provided so as to penetrate through the molding resin and to be connected to the metal conductor. With this configuration, it is possible to apply different potentials to the metal shield and the metal conductor, respectively, so that the metal conductor can be used as, for example, an antenna radiation conductor.

In the present invention, the power supply pattern is preferably provided on the front surface of the substrate, and the bottom portion of the through conductor preferably contacts the upper surface of the power supply pattern. With this configuration, a through hole does not penetrate through the substrate, so that existence of the through conductor dose not reduce a usable area of the back surface of the substrate.

In the present invention, the surface of the metal shield on the molding resin side is preferably roughened. With this configuration, adhesion between the metal shield and the molding resin can be enhanced.

The electronic circuit module according to the present invention preferably further includes a semiconductor chip embedded in the substrate. With this configuration, a more sophisticated electronic circuit module can be provided.

An electronic circuit module manufacturing method according to the present invention includes a first step of mounting an electronic component on the front surface of an aggregate substrate having a power supply pattern, a second step of covering the front surface of the aggregate substrate with a molding resin so as to embed the electronic component therein and covering the upper surface of the molding resin with a metal shield, a third step of forming a through hole in the molding resin to expose the power supply pattern, a fourth step of forming a through conductor inside the through hole to connect the metal shield and the power supply pattern, and a fifth step of cutting the aggregate substrate to obtain individualized electronic circuit modules.

According to the present invention, the metal shield and the power supply pattern are connected to each other through the through conductor penetrating through the molding resin, eliminating the need of forming a connection metal conductor on the side surface of the electronic circuit module, which facilitates manufacturing. In addition, the metal shield is reliably connected to the power supply pattern by the through conductor, so that connection reliability is significantly enhanced.

In the present invention, in the second step, a resin and a metal foil are preferably introduced into a cavity of a die to form the molding resin and the metal shield at the same time. This eliminates the need of separately forming the metal shield, making it possible to reduce the number of manufacturing steps.

In this case, the surface of the metal foil on the side that contacts the resin is preferably roughened. With this configuration, the roughened surface shape of the metal foil is transferred to the surface of the molding resin, so that high adhesion can be ensured.

In this case, the electronic circuit module manufacturing method according to the present invention preferably further includes, after the second step and before the fourth step, a step of once removing the metal shield. In the fourth step, plating is performed to form the through conductor inside the through hole and to form again the metal shield on the upper surface of the molding resin at the same time. This eliminates the need for the patterning of the metal shield even when a predetermined opening is formed in the metal shield. For example, in the fourth step, by selectively performing plating so as not to form the metal shield at a part of the upper surface of the molding resin, a predetermined opening can be formed in the metal shield without pattering the metal shield.

The electronic circuit module manufacturing method according to the present invention preferably further includes a step of exposing a part of the upper surface of the molding resin by partially removing the metal shield. With this configuration, moisture contained in the molding resin is released through the opening during reflow, making it possible to enhance product reliability.

In the present invention, the power supply pattern is preferably formed on the front surface of the aggregate substrate, and the upper surface of the power supply pattern is preferably exposed in the third step. With this configuration, the through hole does not reach the substrate, so that a usable area of the back surface of the substrate is not reduced.

In the fifth step, the aggregate substrate is preferably cut at a position dividing the through hole. With this configuration, one through conductor is shared by two or more electronic circuit modules, so that the planar size of the electronic circuit module can be reduced.

As described above, according to the present invention, the metal shield formed on the upper surface of the molding resin can be easily and reliably connected to the power supply pattern.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

First Embodiment

Figure 1:
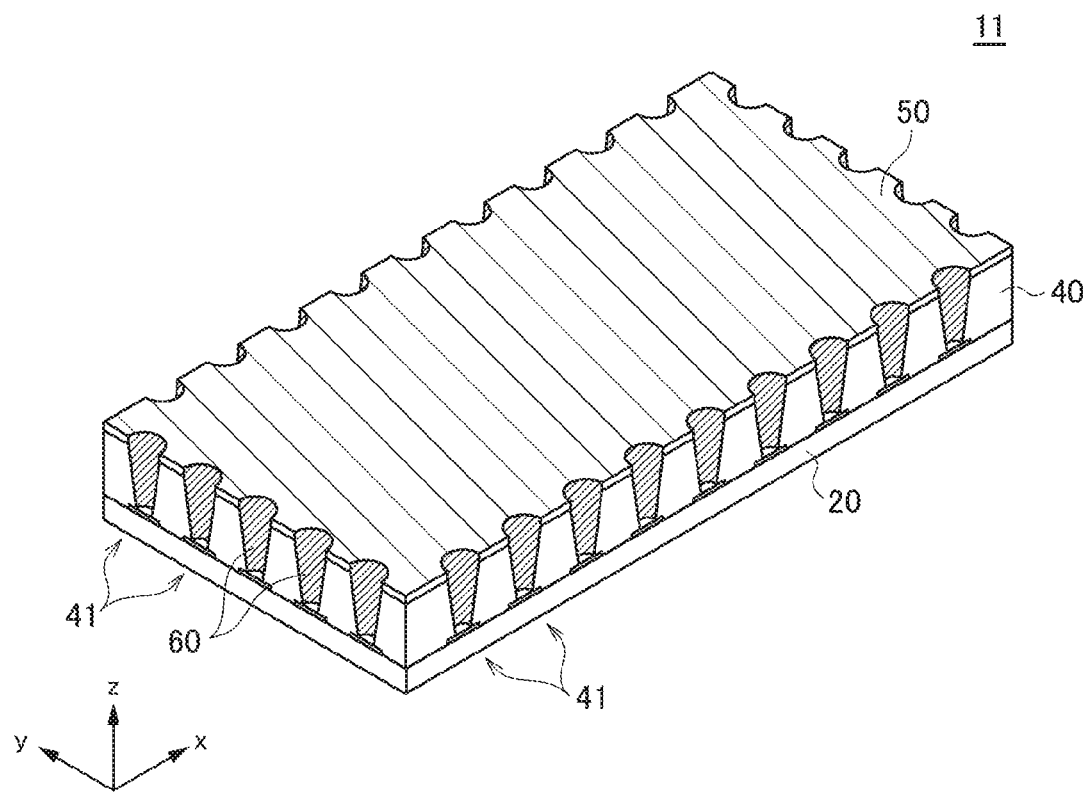
FIG. 1 is a schematic perspective view illustrating the outer appearance of an electronic circuit module according to a first embodiment of the present invention.
Figure 2:
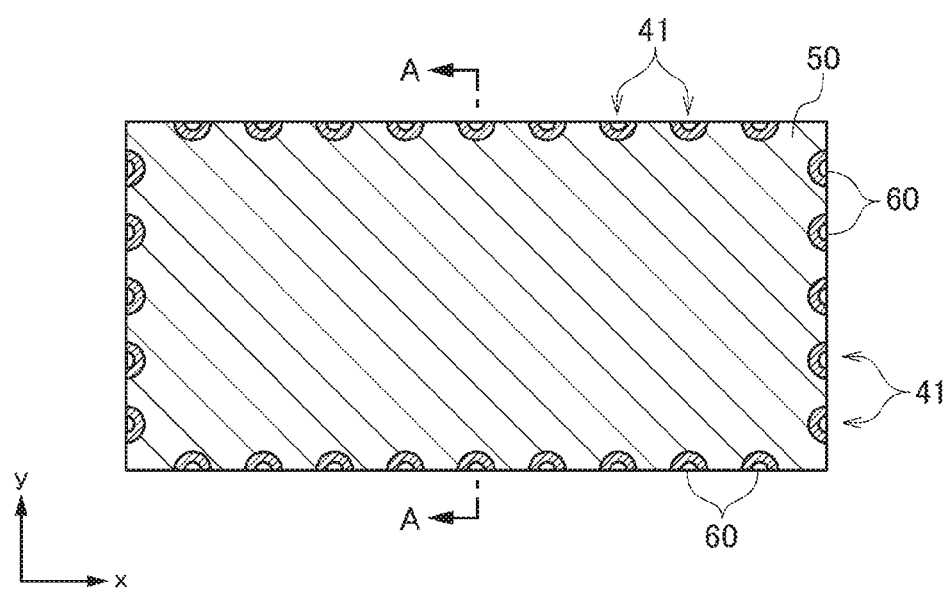
FIGS. 2 to 4 are top, bottom and side views of the electronic circuit module shown in FIG. 1, respectively.
Figure 3:
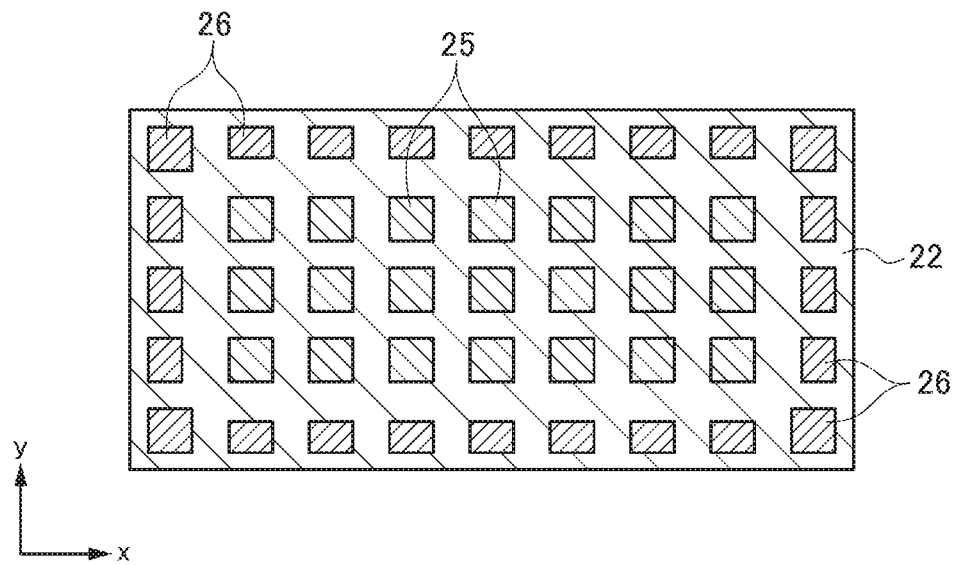
Figure 4:
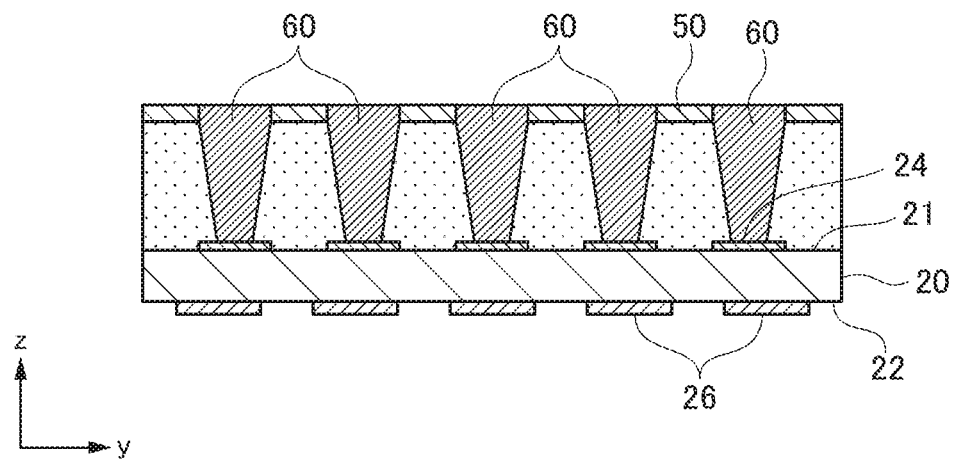
Figure 5:
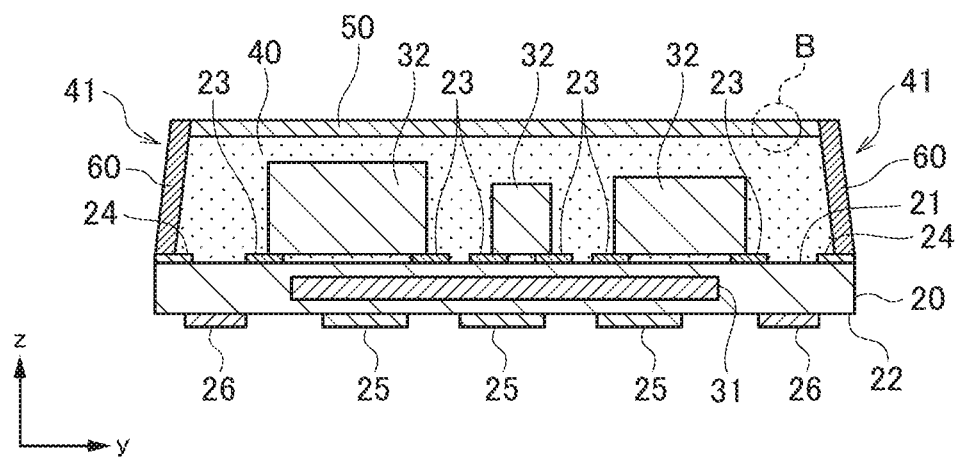
FIG. 5 is a cross-sectional view taken along the line A-A of FIG. 2.

FIG. 1 is a schematic perspective view illustrating the outer appearance of an electronic circuit module 11 according to the first embodiment of the present invention. FIGS. 2 to 4 are top, bottom, and side views of the electronic circuit module 11, respectively, and FIG. 5 is a cross-sectional view taken along the line A-A of FIG. 2.

As illustrated in FIGS. 1 to 5, the electronic circuit module 11 according to the present embodiment includes a substrate 20 in which a semiconductor chip 31 is embedded, a plurality of electronic components 32 mounted on the substrate 20, a molding resin 40 that covers the surface of the substrate 20 so as to embed the electronic components 32 therein, and a metal shield 50 that covers the upper surface of the molding resin 40. Although not particularly limited, the length of the electronic circuit module 11 (x-direction dimension) is about 6 mm, the width thereof (y-direction dimension) is about 3 mm, and the height thereof (z-direction dimension) is about 1 mm.

The substrate 20 is a multilayer circuit substrate inside of which the semiconductor chip 31 is embedded, and a plurality of land patterns 23 and a plurality of power supply patterns 24 are formed on a front surface 21 of the substrate 20. Although it is not essential in the present invention that the semiconductor chip 31 is embedded in the substrate 20, the incorporation of the semiconductor chip 31 allows a sophisticated electronic circuit module to be provided. For example, when the electronic circuit module 11 according to the present embodiment is used as a power supply control module, a power supply controller may be used as the semiconductor chip 31. The semiconductor chip 31 has preferably a reduced thickness of 100 μm or less.

The land patterns 23 are internal electrodes for connection with the electronic components 32. The land patterns 23 and electronic components 32 are electrically and mechanically connected to each other via unillustrated solders. As the electronic components 32, a passive component such as a capacitor or a coil can be taken as an example. The land patterns 23 are connected also to the semiconductor chip 31 through unillustrated internal wiring formed in the substrate 20. The power supply patterns 24 are provided at the outer peripheral portion of the substrate 20 in a plan view (as viewed in the z-direction) and are connected to through conductors 60 to be described later. The power supply patterns 24 each are typically a ground pattern to which a ground potential is given, but not limited thereto, and they may each be at least a pattern to which a fixed potential is given.

A plurality of external terminals 25 and a plurality of external terminals 26 are provided on a back surface 22 of the substrate 20. The external terminals 25 are each a signal input/output terminal and arranged at the center portion of the back surface 22 of the substrate 20, as illustrated in FIG. 3. On the other hand, the external terminals 26 are each a ground terminal and arranged at the outer peripheral portion of the back surface 22 of the substrate 20 so as to surround the external terminal 25, as illustrated in FIG. 3. During actual use, the electronic circuit module 11 is mounted on an unillustrated motherboard, and terminal electrodes on the mother board and external terminals 25 and 26 of the electronic circuit module 11 are electrically connected.

The molding resin 40 covers the front surface 21 of the substrate 20 so as to embed the electronic components 32 therein. In the present embodiment, a plurality of through holes 41 are formed in the molding resin 40 along the outer peripheral portion of the electronic circuit module 11 in a plan view, and the power supply patterns 24 are exposed at their respective bottom portions. As described later, the though hole 41 is shared by two electronic circuit modules 11, so that the inner wall of the through hole 41 is not closed in a final product but is opened to the side surface of the electronic circuit module 11. Thus, the term "through hole" used in the present invention is not limited to a tubular body having a closed inner wall but may be at least a cutout connecting the upper and lower surfaces of the molding resin obtained by removing the molding resin 40 in the z-direction.

A through conductor 60 is formed in the inner wall of the through hole 41. As a result, the bottom portion of the through conductor 60 contacts the upper surface of the power supply pattern 24, and thus the through conductor 60 and the power supply pattern 24 are electrically connected to each other. Further, in the present embodiment, since the through hole 41 of the molding resin 40 is opened to the side surface of the electronic circuit module 11, the through conductor 60 is also exposed to the side surface of the electronic circuit module 11. As illustrated in FIGS. 1 and 2, the through conductors 60 are arranged on the side surfaces of the electronic circuit module 11 at predetermined intervals and thereby function as an electromagnetic shield in the side surface direction. The arrangement pitch of the through conductors 60 may be determined according to a frequency of a signal processed by the electronic circuit module 11 or a power supply. That is, the through conductors 60 may be arranged at a pitch that can shield electromagnetic noise according to a frequency of a signal processed by the electronic circuit module 11 or a power supply.

The upper surface of the molding resin 40 is covered with the metal shield 50 made of copper or the like. The metal shield 50 is connected to the power supply patterns 24 through the plurality of through conductors 60 and is thus applied with a fixed potential (e.g., a ground potential), thereby functioning as an electromagnetic shield in the upper surface direction. In the present embodiment, the entire upper surface of the molding resin 40 is covered with the metal shield 50, thereby enhancing shielding effect.

As described above, in the electronic circuit module 11 according to the present embodiment, the metal shield 50 functions as an electromagnetic shield in the upper surface direction, and the plurality of through conductors 60 function as an electromagnetic shield in the side surface direction, so that it is possible to obtain the same state as that where the entire molding resin 40 is covered with a metal shield casing. As a result, radiation noise and external noise can be effectively shielded. In addition, the through conductor 60 is connected to the power supply pattern 24 formed on the front surface 21 of the substrate 20, so that there is little possibility that a connection failure occurs unlike a case where the connection is made on the side surface of the substrate 20.

Figure 6:
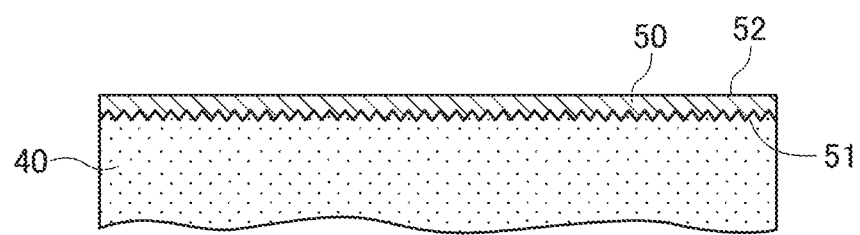
FIG. 6 is an enlarge view of a region B illustrated in FIG. 5.

FIG. 6 is an enlarge view of a region B illustrated in FIG. 5. As illustrated in FIG. 6, in the present embodiment, the upper and lower surfaces 52 and 51 of the metal shield 50 have different surface properties. Specifically, the upper surface 52 of the metal shield 50 is comparatively flat, whereas the lower surface 51 that contacts the molding resin 40 is roughened, and the surface property of the roughened lower surface 51 is transferred to the upper surface of the molding resin 40, whereby adhesion between the molding resin 40 and the metal shield 50 is enhanced. Such a structure is attributable to a manufacturing method to be described later.

The following describes a manufacturing method for the electronic circuit module 11 according to the present embodiment.

FIGS. 7 to 12 are process views for explaining the manufacturing method for the electronic circuit module 11 according to the present embodiment.

Figure 7:
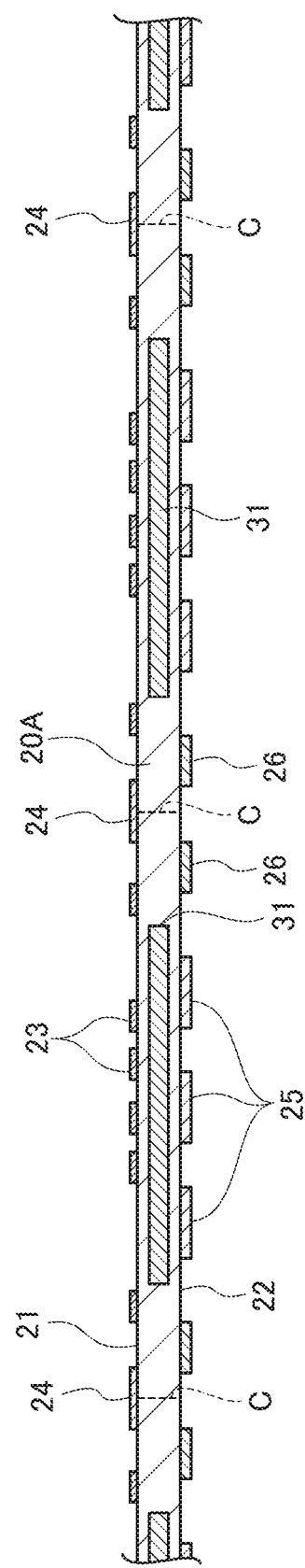
FIGS. 7 to 12 are process views for explaining the manufacturing method for the electronic circuit module according to the first embodiment of the present invention.

First, as illustrated in FIG. 7, an aggregate substrate 20A in which the semiconductor chips 31 are embedded is prepared. The land pattern 23 and power supply patterns 24 are formed on the front surface 21 of the aggregate substrate 20A. Further, the external terminals 25 and 26 are formed on the back surface 22 of the aggregate substrate 20A. The dashed lines C illustrated in FIG. 7 each denote a part to be cut in the subsequent dicing process. As illustrated in FIG. 7, the power supply pattern 24 formed on the front surface 21 of the aggregate substrate 20A is provided at a position overlapping the dashed line C in a plan view.

Figure 8:
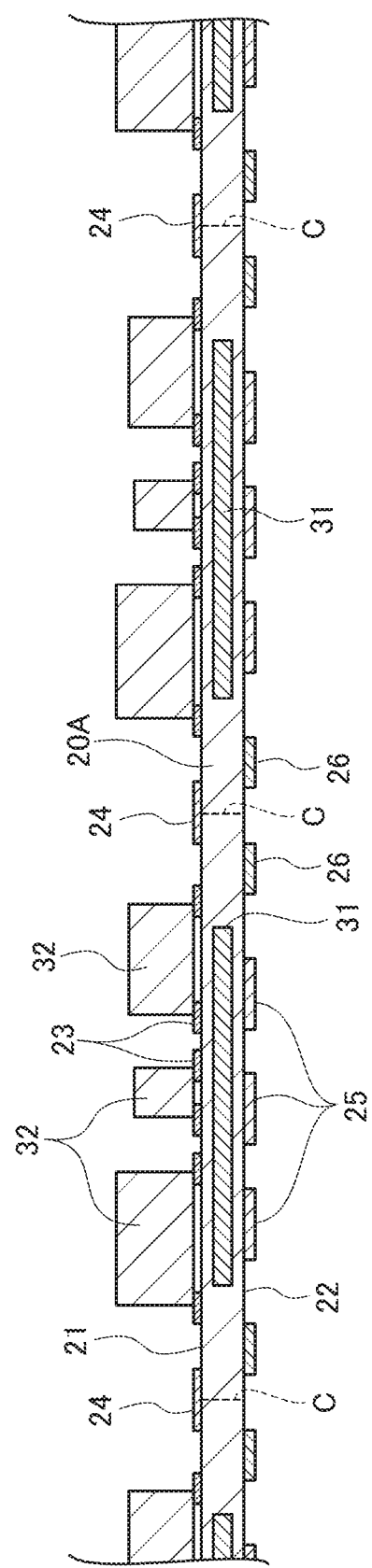

Then, as illustrated in FIG. 8, the electronic components 32 are mounted on the front surface 21 of the aggregate substrate 20A so as to be connected to the land pattern 23. Specifically, a solder is supplied onto the land pattern 23, and then the electronic component 32 is mounted on the land pattern 23, followed by reflow, whereby the electronic component 32 is connected to the land pattern 23.

Figure 9:
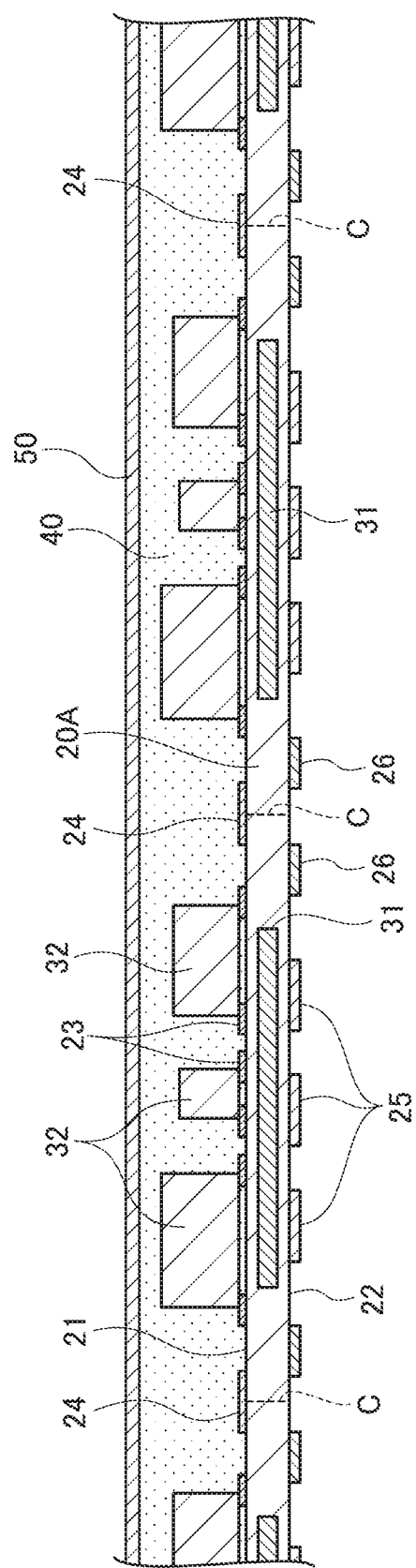

Then, as illustrated in FIG. 9, the front surface 21 of the aggregate substrate 20A is covered with the molding resin 40 so as to embed the electronic component 32 in the molding resin 40, and the upper surface of the molding resin 40 is covered with the metal shield 50. Specifically, it is preferable to form the molding resin 40 and metal shield 50 at the same time by introducing a resin and a metal foil into a cavity of an unillustrated die and performing molding in this state. This method eliminates the need for separately forming the metal shield 50, making it possible to reduce the number of manufacturing steps.

In this case, the surface of the metal foil to be used is preferably roughened on the side that contacts the resin. With this configuration, the surface property of the metal foil is transferred to the soften resin, so that high adhesion can be obtained as described using FIG. 6. In addition, a dedicated process for roughening the molding resin 40 is unnecessary. However, it is not essential in the present invention that the molding resin 40 and metal shield 50 are formed simultaneously, but after formation of the molding resin 40, the molding resin 40 and metal shield 50 may be formed sequentially in this order.

Figure 10:
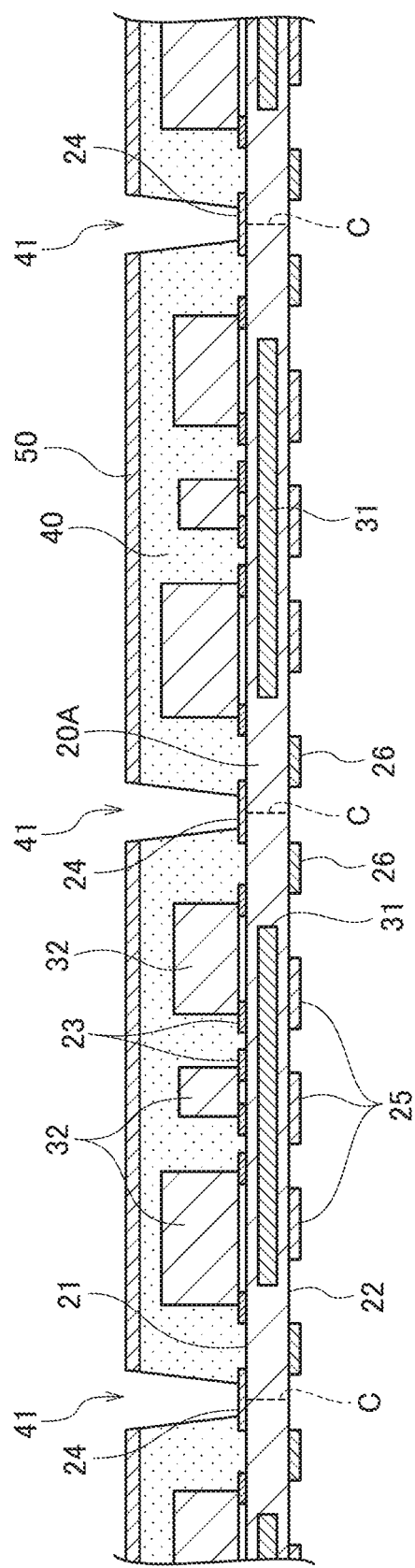

Then, as illustrated in FIG. 10, the through holes 41 are formed in the molding resin 40 to expose the power supply patterns 24. While a method of forming the through hole 41 is not particularly limited, laser machining or drilling may be used. When laser machining is used, the upper surface of the molding resin 40 is exposed by removing a part of the metal shield 50 at which the through hole 41 is formed, and a laser beam is irradiated onto the exposed part to form the through hole 41. In this laser machining, the power supply pattern functions as a stopper, thus achieving high controllability. On the other hand, when drilling is used, drilling may be stopped at the time point when the tip end of the drill reaches the power supply pattern 24. The drilling is advantageous in that it can form many through holes 41 in a short time.

Figure 11:
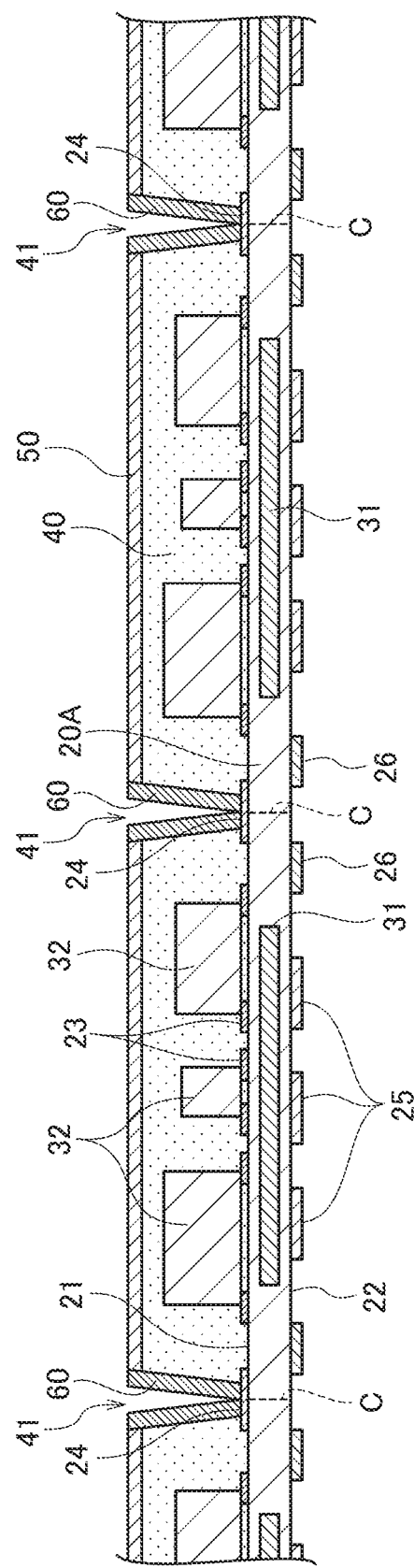

Then, as illustrated in FIG. 11, plating is performed to form the through conductor 60 inside the through hole 41. At this time, plating is also formed on the upper surface of the metal shield 50. As described above, the power supply pattern 24 is exposed at the bottom portion of the through hole 41, so that the though conductor 60 electrically connects the power supply pattern 24 to the metal shield 50. However, a method of forming the through conductor 60 is not limited to the plating.

Figure 12:
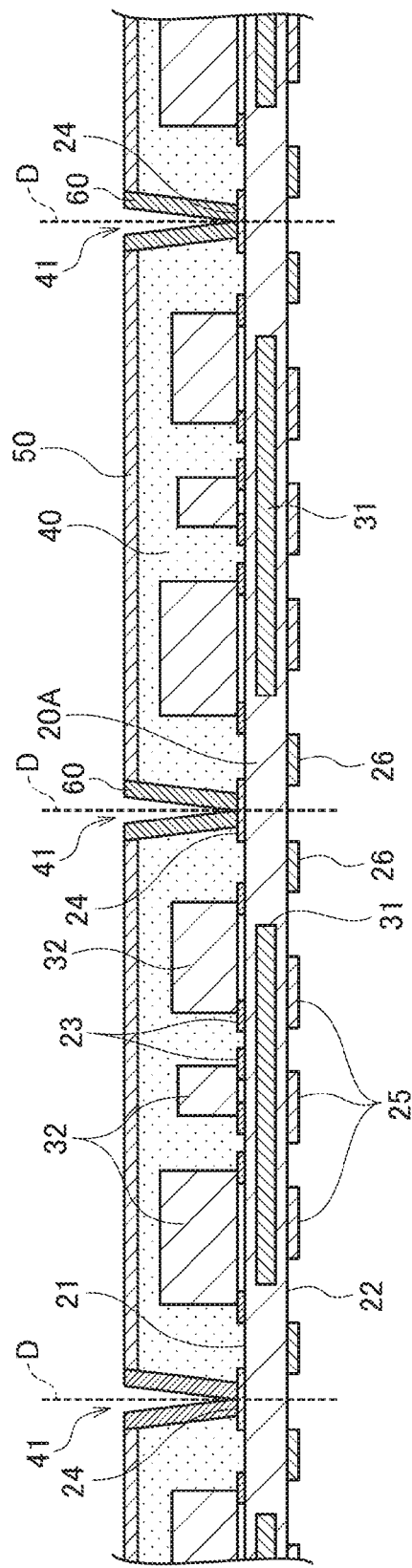

Then, as illustrated in FIG. 12, the aggregate substrate 20A is cut along the dicing line D coinciding with the dashed line C and, thereby, a plurality of diced electronic circuit modules 11 can be obtained. In the present embodiment, the through holes 41 are arranged along the respective dicing lines D, so that when the aggregate substrate 20A is cut along the dicing line D, one through conductor 60 is divided into two pieces, and the two pieces belong to the adjacent electronic circuit modules 11, respectively. Thus, the side surface of the molding resin 40 is effectively used, whereby the planar size of the electronic circuit module 11 can be reduced.

As described above, in the manufacturing method for the electronic circuit module 11 according to the present embodiment, when the aggregate substrate 20A is cut to divide the electronic circuit module 11 into individual module pieces, all major processes are completed. That is, it is not necessary to perform additional process, such as formation of conductors on the side surface as the cut surface. Thus, the manufacturing process can be simplified as compared with conventional methods that form connection conductors on the side surface.

As described above, in the electronic circuit module 11 according to the present embodiment, the power supply pattern 24 and the metal shield 50 are connected to each other through the through conductor 60 formed so as to penetrate through the molding resin 40 in the z-direction, so that connection reliability between the power supply pattern 24 and the metal shield 50 is enhanced. Further, it is not necessary to form conductors on the dicing cut surface, so that the manufacturing method can be simplified.

In addition, in the present embodiment, the side surfaces of the molding resin 40 are surrounded by the plurality of through conductors 60, allowing electromagnetic shield to be applied to all electronic components 32 covered with the molding resin 40. Further, in the present embodiment, the through hole 41 does not penetrate through the substrate 20, allowing effective use of the back surface 22 of the substrate 20.

Second Embodiment

Figure 13:
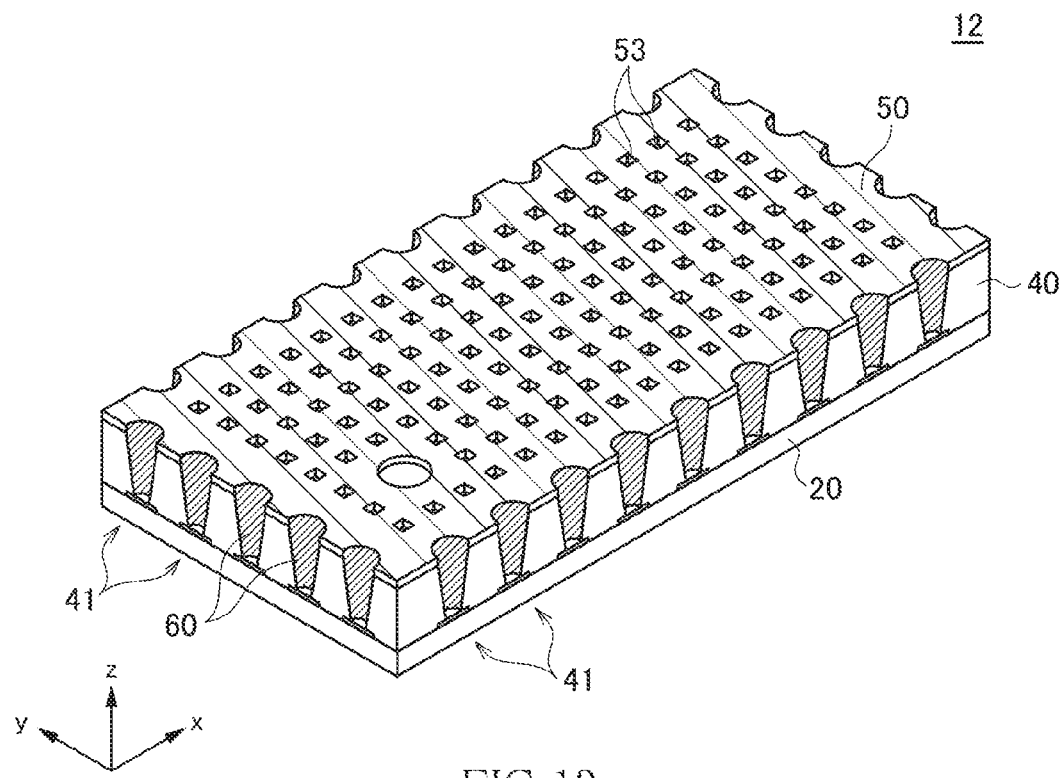
FIG. 13 is a schematic perspective view illustrating the outer appearance of an electronic circuit module according to a second embodiment of the present invention.
Figure 14:
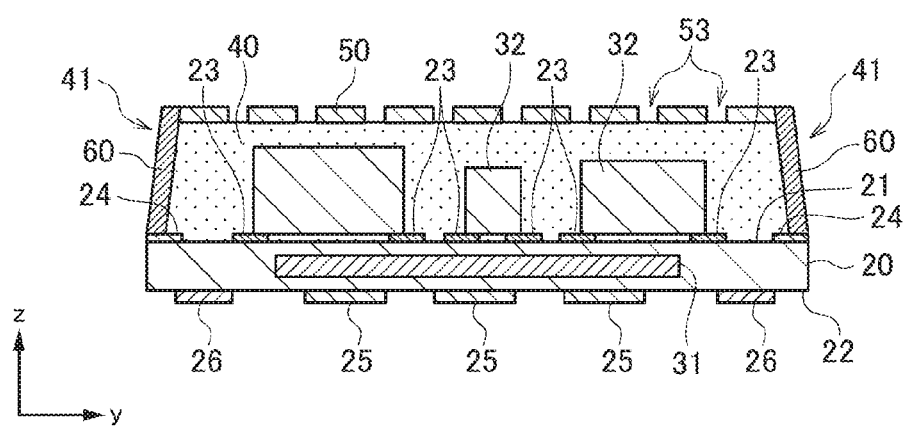
FIG. 14 is a cross-sectional view of the electronic circuit module shown in FIG. 13.

FIG. 13 is a schematic perspective view illustrating the outer appearance of an electronic circuit module 12 according to the second embodiment of the present invention. FIG. 14 is a cross-sectional view of the electronic circuit module 12.

As illustrated in FIGS. 13 and 14, the electronic circuit module 12 according to the present embodiment differs from the electronic circuit module 11 according to the first embodiment in that a plurality of openings 53 are formed in the metal shield 50. Other configurations are the same as those of the electronic circuit module 11 according to the first embodiment, so the same reference numerals are given to the same elements, and overlapping description will be omitted.

The openings 53 formed in the metal shield 50 are regularly arranged in the x- and y-directions, and the upper surface of the molding resin 40 is exposed at the openings 53. As a result, moisture contained in the molding resin 40 is released from the openings 53, so that it is possible to prevent degradation in reliability due to moisture expansion during reflow. The number, size, and arrangement of the openings 53 are not particularly limited and may be arbitrarily designed so as not to impair electromagnetic shielding effect of the metal shield 50 with a target frequency band taken into consideration. For example, the number, size, and pitch of the openings 53 may be optimized for each area according to a frequency band to be shielded, or a two-dimensional code representing the product number or lot number of the module may be created on the basis of the shape and layout of the openings 53. In the example of FIG. 13, the size of one opening 53 located at the lower-left corner is made larger than those of other openings 53, and the larger opening 53 is used as a directionality mark.

Figure 15:
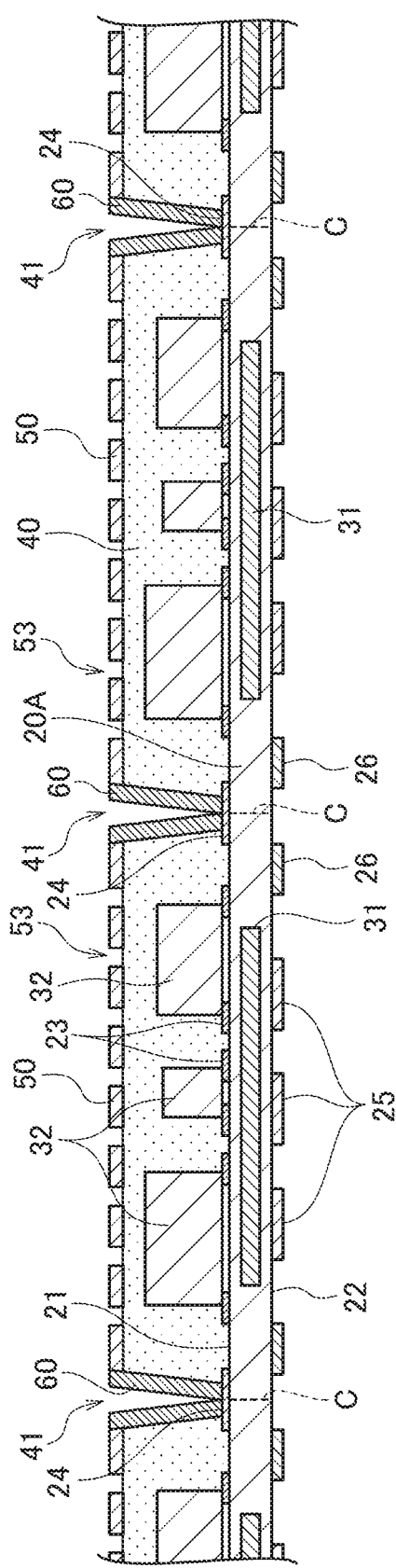
FIG. 15 is a process view for explaining an example of the manufacturing method for the electronic circuit module according to the second embodiment of the present invention.

FIG. 15 is a process view for explaining an example of the manufacturing method for the electronic circuit module 12 according to the present embodiment. In this example, after completion of the processes described using FIGS. 7 to 11, the metal shield 50 is patterned to form the openings 53 to thereby partially expose the upper surface of the molding resin 40 as illustrated in FIG. 15. The patterning of the metal shield 50 can be performed using a photolithography technique. As a result, the number, size, and shape of the openings 53 can be arbitrarily set.

Figure 16:
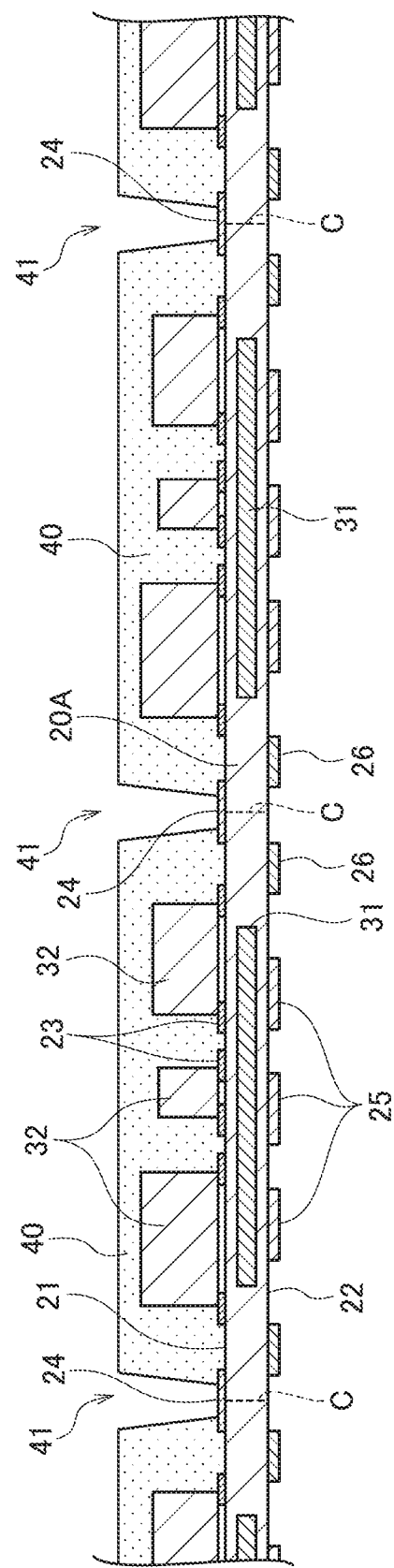
FIGS. 16 and 17 are views illustrating another example of the manufacturing method for the electronic circuit module according to the second embodiment of the present invention.
Figure 17:
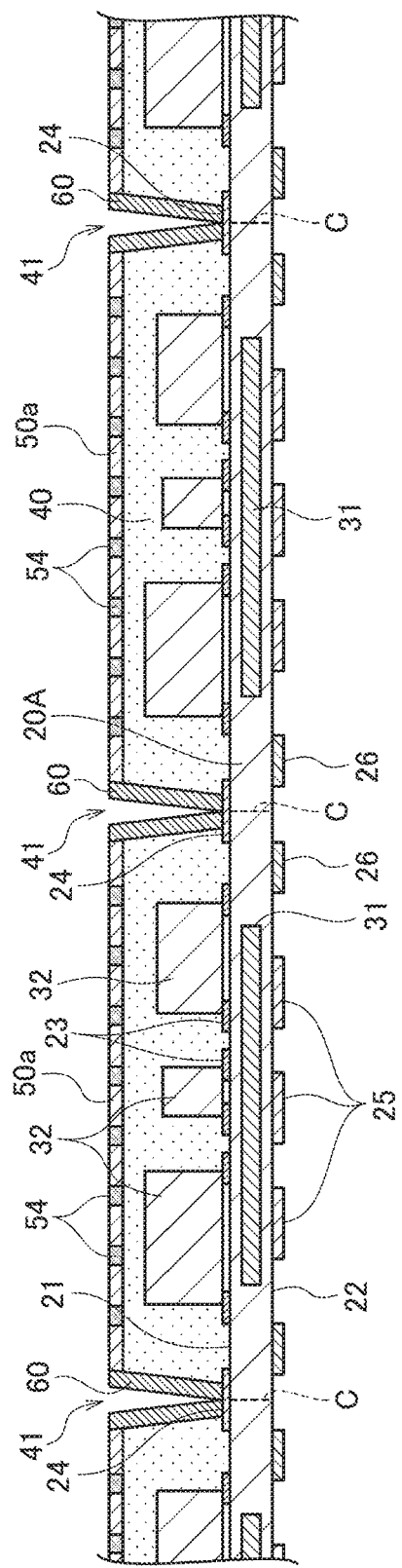

FIGS. 16 and 17 are views illustrating another example of the manufacturing method for the electronic circuit module 12 according to the present embodiment. In this example, after completion of the processes described using FIGS. 7 to 9, the metal shield 50 is once completely removed as illustrated in FIG. 16. The removing of the metal shield 50 can be achieved by, e.g., wet etching using acid. As a result, although the metal shield 50 is once completely removed, the surface property of the roughened lower surface 51 of the metal shield 50 is transferred to the upper surface of the molding resin 40, so that the upper surface of the molding resin 40 is roughened in an extremely high density.

Then, the through holes 41 are formed in the molding resin 40 to expose the power supply patterns 24. This process can be performed using laser machining or drilling as described using FIG. 10. Although the metal shield 50 is removed before formation of the through holes 41 in the above description, it may be removed after formation of the through holes 41.

Then, as illustrated in FIG. 17, plating is performed with a mask 54 formed in a portion at which the opening 53 is formed. As a result, the through conductor 60 is formed inside the through hole 41 and, at the same time, the metal shield is formed again on the upper surface of the molding resin 40 as a metal shield 50a. According to this method, formation of the mask 54 allows the upper surface of the molding resin 40 to be selectively plated to thereby eliminate the need for subsequent patterning of the metal shield 50a. In addition, the metal shield 50a is formed on the high-density roughened upper surface of the molding resin 40 and can thus be made to extremely tightly adhere to the molding resin 40 like the originally formed metal shield 50.

Third Embodiment

Figure 18:
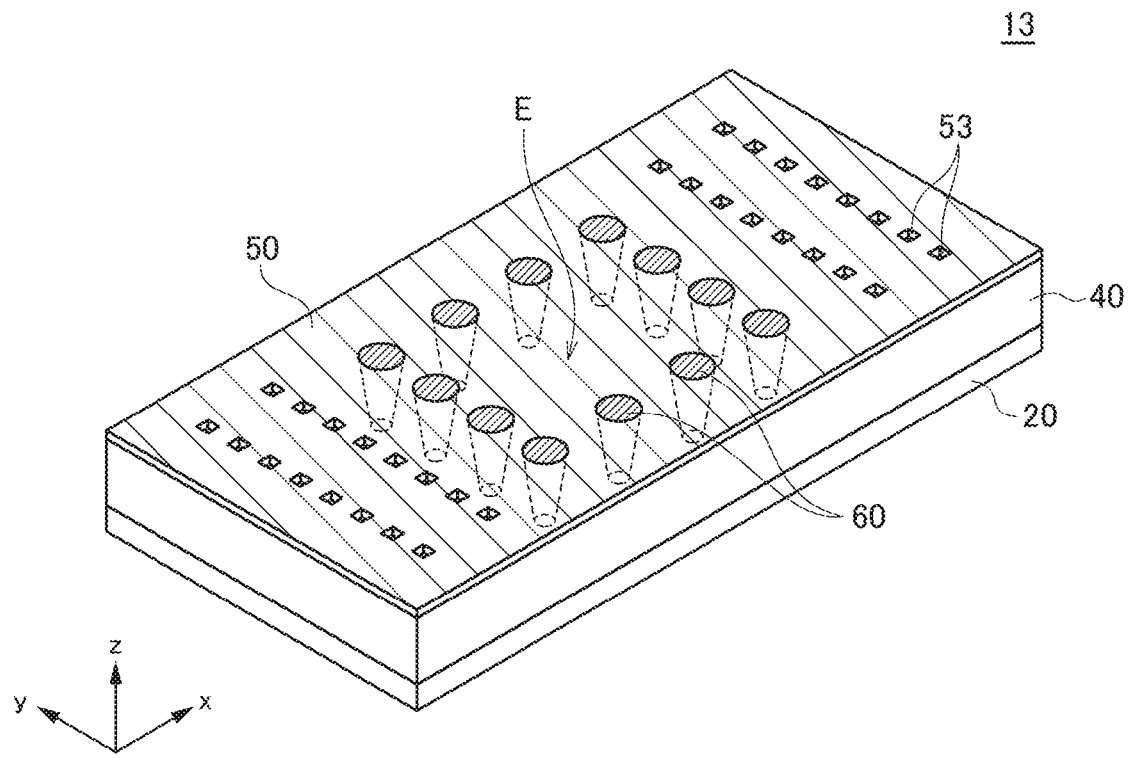
FIG. 18 is a schematic perspective view illustrating the outer appearance of an electronic circuit module according to a third embodiment of the present invention.
Figure 19:
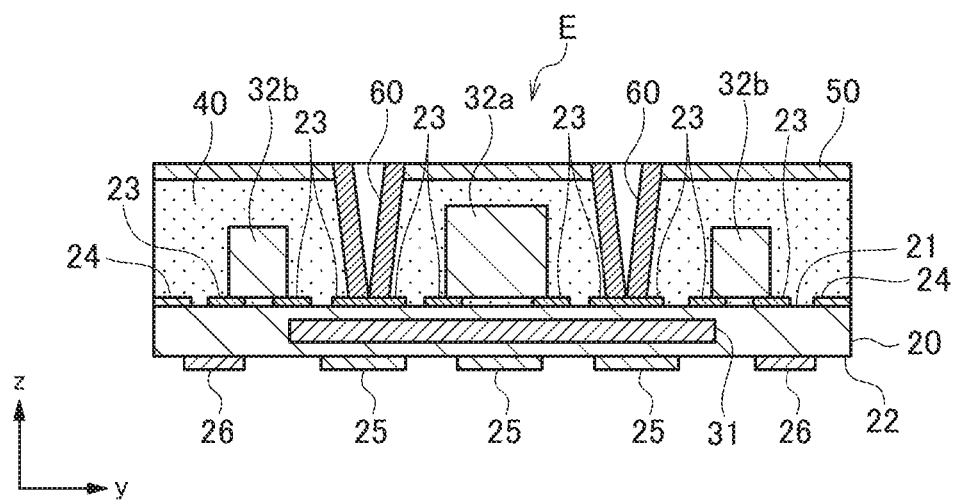
FIG. 19 is a cross-sectional view of the electronic circuit module shown in FIG. 18.

FIG. 18 is a schematic perspective view illustrating the outer appearance of an electronic circuit module 13 according to the third embodiment of the present invention. FIG. 19 is a cross-sectional view of the electronic circuit module 13.

As illustrated in FIGS. 18 and 19, the electronic circuit module 13 according to the present embodiment differs from the electronic circuit module 12 according to the second embodiment in that the through conductors 60 are not exposed to the side surface of the molding resin 40 and formed so as to surround a predetermined region E in a plan view. Other configurations are the same as those of the electronic circuit module 12 according to the second embodiment, so the same reference numerals are given to the same elements, and overlapping description will be omitted.

In the present embodiment, the predetermined region E is positioned at substantially the center of the substrate in a plan view. The region E is a region where an electronic component 32a that can be a noise source or that is significantly affected by external noise is mounted. The electronic components 32a is surrounded by the plurality of through conductors 60 in a plan view, and a space above the electronic components 32a is covered with the metal shield, so that it is possible to properly shield the electronic component 32a that can be a noise source or that is significantly affected by external noise. Another electronic component 32b is positioned outside the region E and is thus not surrounded by the through conductors 60.

As described above, it is not essential in the present invention that all the electronic components (32a and 32b in the example of FIG. 19) are surrounded by the through conductors 60, but only a specific electronic component (32a in the example of FIG. 19) to be shielded may be surrounded by the through conductors 60. Further, it is not essential in the present invention that the through conductors 60 are exposed to the side surface of the molding resin 40. When the through conductors 60 are not exposed to the side surface of the molding resin 40 as in the present embodiment, the through conductors 60 need not be cut in the dicing process, so that dicing conditions are advantageously eased.

Further, in the example of FIG. 18, within the region E, no openings 53 are formed in the metal shield 50, whereby shielding effect is enhanced. On the other hand, outside the region E, the plurality of openings 53 are formed in the metal shield 50, whereby moisture release is promoted during reflow.

Fourth Embodiment

Figure 20:
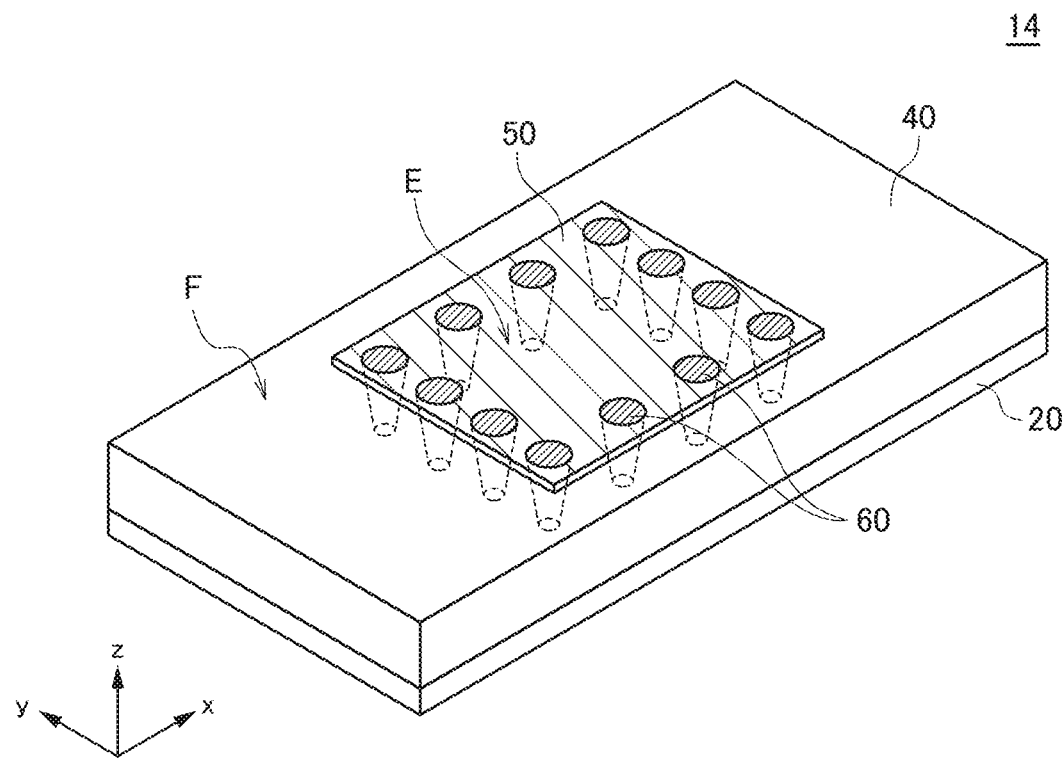
FIG. 20 is a schematic perspective view illustrating the outer appearance of an electronic circuit module according to a fourth embodiment of the present invention.
Figure 21:
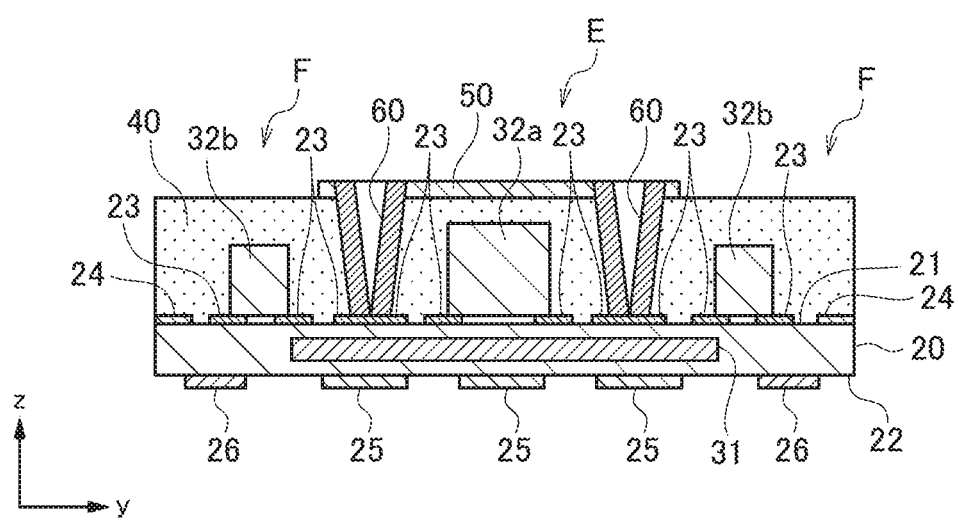
FIG. 21 is a cross-sectional view of the electronic circuit module shown in FIG. 20.

FIG. 20 is a schematic perspective view illustrating the outer appearance of an electronic circuit module 14 according to the fourth embodiment of the present invention. FIG. 21 is a cross-sectional view of the electronic circuit module 14.

As illustrated in FIGS. 20 and 21, the electronic circuit module 14 according to the present embodiment differs from the electronic circuit module 13 according to the third embodiment in that the metal shield 50 is selectively formed in the region E. Other configurations are the same as those of the electronic circuit module 13 according to the third embodiment, so the same reference numerals are given to the same elements, and overlapping description will be omitted.

In the present embodiment, a region F positioned outside the region E in a plan view is a region not requiring electromagnetic shielding, and the metal shield 50 is not formed in the region F. Thus, it is not essential that the metal shield 50 is formed on the entire region of the upper surface of the molding resin 40, and the metal shield 50 may be selectively formed at a position that covers the specific electronic component 32a to be shielded. This can reduce the height of the electronic circuit module 14 in the region F and make the metal shield 50 and other electronic components unlikely to short-circuit. Further, it is unnecessary to cut the metal shield 50 and through conductors 60 in the dicing process, so that dicing conditions are advantageously eased. Further, the upper surface of the molding resin 40 is completely exposed in the region F, so that moisture contained in the molding resin 40 is easily released during reflow.

Fifth Embodiment

Figure 22:
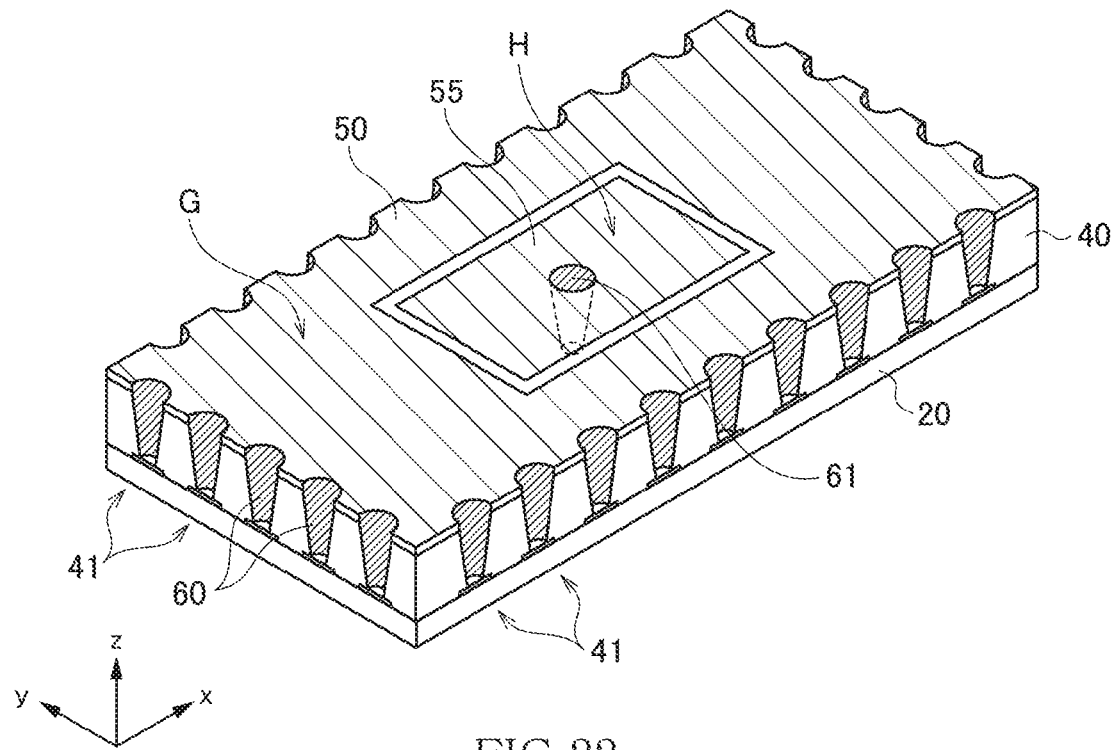
FIG. 22 is a schematic perspective view illustrating the outer appearance of an electronic circuit module according to a fifth embodiment of the present invention.
Figure 23:
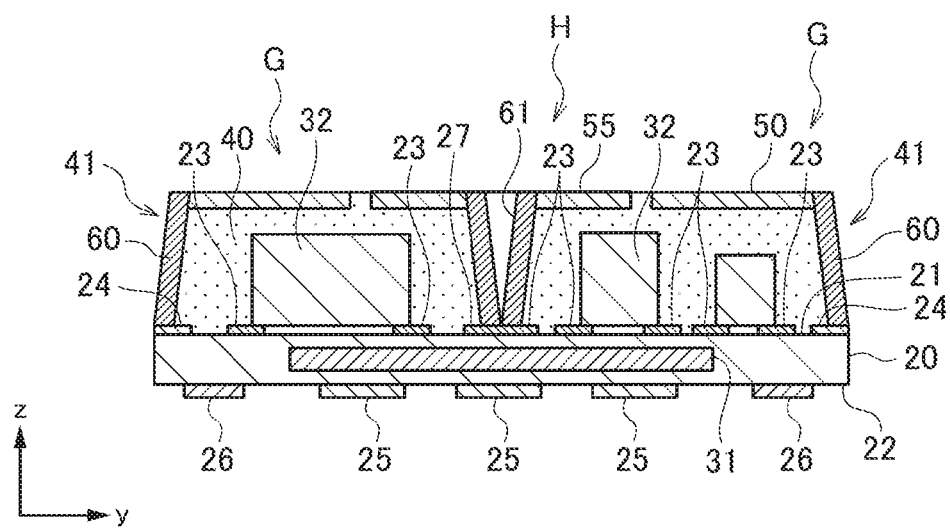
FIG. 23 is a cross-sectional view of the electronic circuit module shown in FIG. 22.

FIG. 22 is a schematic perspective view illustrating the outer appearance of an electronic circuit module 15 according to the fifth embodiment of the present invention. FIG. 23 is a cross-sectional view of the electronic circuit module 15.

As illustrated in FIGS. 22 and 23, in the electronic circuit module 15 according to the present embodiment, the metal shield 50 is formed in a region G on the upper surface of the molding resin 40, and a metal conductor 55 insulated and isolated from the metal shield 50 is formed on another region H on the upper surface of the molding resin 40. The metal conductor 55 is connected to a wiring pattern 27 through a through conductor 61 different from the through conductors 60. Other configurations are the same as those of the electronic circuit module 11 according to the first embodiment, so the same reference numerals are given to the same elements, and overlapping description will be omitted.

The metal conductor 55 is, e.g., an antenna radiation conductor. In this case, the wiring pattern 27 and through conductor 61 constitute a feeding pattern connected to an unillustrated antenna circuit. Such a configuration can be obtained by patterning a part of the metal shield 50. As described above, a part of the metal shield 50 formed on the upper surface of the molding resin 40 may be electrically isolated for other usages such as the antenna radiation conductor.

It is apparent that the present invention is not limited to the above embodiments, but may be modified and changed without departing from the scope and spirit of the invention.

For example, the electronic circuit modules according to the above respective embodiments each have the plurality of through conductors 60; however, this point is not essential in the present invention and, when shielding effect in the side surface direction is not necessary, a single through conductor 60 may be used to electrically connect the metal shield 50 to the power supply pattern 24.

What is claimed is:

1. An electronic circuit module comprising:
   a substrate having a power supply pattern that supplies a predetermined potential;
   an electronic component mounted on a front surface of the substrate;
   a molding resin that covers the front surface of the substrate so as to embed the electronic component therein;
   a metal shield covering the molding resin, the metal shield having an opening that exposes an upper surface of the molding resin, and
   a through conductor formed so as to penetrate through the molding resin to electrically connect the metal shield to the power supply pattern so that the metal shield is fixed to the predetermined potential.

2. The electronic circuit module as claimed in claim 1, wherein a plurality of the through conductors are provided so as to surround the electronic component in a plan view.

3. The electronic circuit module as claimed in claim 1, wherein the through conductor is exposed to a side surface of the molding resin.

4. The electronic circuit module as claimed in claim 1, wherein the metal shield covers an entire upper surface of the molding resin.

5. The electronic circuit module as claimed in claim 2, wherein the metal shield is selectively provided at a position that covers the electronic component.

6. The electronic circuit module as claimed in claim 1, further comprising:
   a metal conductor provided so as to cover the molding resin, the metal conductor and the metal shield being isolated from each other; and
   another through conductor provided so as to penetrate through the molding resin to be connected to the metal conductor.

7. The electronic circuit module as claimed in claim 1, wherein the power supply pattern is provided on the front surface of the substrate, and
   wherein a bottom portion of the through conductor contacts an upper surface of the power supply pattern.

8. The electronic circuit module as claimed in claim 1, wherein a surface of the metal shield on the molding resin side is roughened.

9. The electronic circuit module as claimed in claim 1, further comprising a semiconductor chip embedded in the substrate.

10. An electronic circuit module comprising:
    a substrate having a power supply pattern;
    an electronic component mounted on a front surface of the substrate;
    a molding resin that covers the front surface of the substrate so as to embed the electronic component therein;
    a metal shield covering the molding resin; and
    a through conductor formed so as to penetrate through the molding resin to connect the metal shield to the power supply pattern,
    wherein the through conductor is exposed to a side surface of the molding resin.

11. The electronic circuit module as claimed in claim 10, wherein a plurality of the through conductors are provided so as to surround the electronic component in a plan view.

12. The electronic circuit module as claimed in claim 10, wherein the metal shield covers an entire upper surface of the molding resin.

13. The electronic circuit module as claimed in claim 10, wherein the metal shield has an opening that exposes an upper surface of the molding resin.

14. The electronic circuit module as claimed in claim 11, wherein the metal shield is selectively provided at a position that covers the electronic component.

15. The electronic circuit module as claimed in claim 10, further comprising:
    a metal conductor provided so as to cover the molding resin, the metal conductor and the metal shield being isolated from each other; and
    another through conductor provided so as to penetrate through the molding resin to be connected to the metal conductor.

16. The electronic circuit module as claimed in claim 10, wherein the power supply pattern is provided on the front surface of the substrate, and
    wherein a bottom portion of the through conductor contacts an upper surface of the power supply pattern.

17. The electronic circuit module as claimed in claim 10, wherein a surface of the metal shield on the molding resin side is roughened.

18. The electronic circuit module as claimed in claim 10, further comprising a semiconductor chip embedded in the substrate.

19. An electronic circuit module comprising:
    a substrate having a power supply pattern;
    an electronic component mounted on a front surface of the substrate;
    a molding resin that covers the front surface of the substrate so as to embed the electronic component therein;
    a metal shield covering the molding resin; and
    a plurality of through conductors provided along a side surface of the molding resin and formed so as to penetrate through the molding resin to connect the metal shield to the power supply pattern,
    wherein a diameter of the through conductor on the metal shield is greater than a diameter of the through conductor on the power supply pattern.

* * * * *